(12) United States Patent
Scarzello et al.

(10) Patent No.: US 6,417,665 B1
(45) Date of Patent: *Jul. 9, 2002

(54) SPATIALLY INTEGRATING FLUXGATE MANETOMETER HAVING A FLEXIBLE MAGNETIC CORE

(75) Inventors: John F. Scarzello; John J. Holmes; Edward C. O'Keefe, all of Columbia, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/517,560

(22) Filed: Mar. 2, 2000

Related U.S. Application Data

(60) Provisional application No. 60/123,176, filed on Mar. 5, 1999.

(51) Int. Cl.[7] .............................................. G01R 33/04

(52) U.S. Cl. ..................................................... 324/253

(58) Field of Search ................................. 324/253, 254, 324/255, 260, 244, 258, 326; 33/361

(56) References Cited

U.S. PATENT DOCUMENTS

| | | | |
|---|---|---|---|
| 3,821,637 A | 6/1974 | Svala | 324/222 |
| 4,068,164 A | 1/1978 | Schwartz et al. | 324/226 |
| 5,008,621 A | 4/1991 | Jiles | 324/227 |
| 5,014,006 A * | 5/1991 | Seitz | 324/249 |
| 5,329,269 A | 7/1994 | Watson | 336/213 |
| 5,672,967 A * | 9/1997 | Jensen et al. | 324/253 |

OTHER PUBLICATIONS

Scarzello, John F. and Edward C. O'Keefe, "Development of Shipboard Magnetic Sensors for Degaussing System Controllers," NSWCCD–TR–98/011, Jun. 30, 1998, Machinery Research and Development Directorate Research and Development Report, Naval Surface Warfare Center, Carderock Division, West Bethesda, Maryland 20817–5700.
Lenz, James E., "A Review of Magnetic Sensors," *IEEE Proceedings*, vol. 78, No. 6, Jun. 1990, pp. 973–989.
Gordon, Daniel I., Robert E. Brown and John F. Haben, "Methods for Measuring the Magnetic Field," *IEEE Trans. Mag.*, vol. Mag–8, No. 1, Mar. 1972, pp 48–51.

(List continued on next page.)

*Primary Examiner*—Edward Lefkowitz
*Assistant Examiner*—Reena Aurora
(74) *Attorney, Agent, or Firm*—Howard Kaiser

(57) ABSTRACT

A magnetic field sensor based on fluxgate magnetometric principles includes a magnetic core having a highly elongated oblong configuration and accordingly defining a closed magnetic flux path. The core includes flexible amorphous magnetic material. A drive winding is wound about each of two linear sections of the core. The two drive winding-wound linear core sections are closely coupled in parallel adjacent disposition. A sense winding is wound about the drive winding-wound core, thereby forming a narrow unitary strip-like sensor construction which, depending on the embodiment, can be practically any length. Typically, a very long sensor is situated huggingly or abuttingly with respect to a great expanse of a ferromagnetic material surface. The sensor is capable of generating a detectable signal which is representative of the "integration" of magnetic field components over the length of the core. The invention's integrative function minimizes measurement skewing or distortion attributable to anomalous characteristics of the ferromagnetic material being sensed. The invention's "integrative" sensor admits of systematic association with any number and diverse kinds of "point" sensors, in furtherance of more complete data acquisition.

20 Claims, 4 Drawing Sheets

OTHER PUBLICATIONS

Gordon, Daniel I. and Robert E. Brown, "Recent Advances in Fluxgate Magnetometry," *IEEE Trans. Mag.*, vol. Mag–8, No. 1, Mar. 1972, pp. 76–82.

Gordon, D. I., R. H. Lundsten, R. A. Chiarodo, H. H. Helms, "A Fluxgate Sensor of High Stability for Low Field Magnetometry," *IEEE Transactions on Magnetics*, vol. MAG–4, 1968, pp. 379–401.

Acuna, M. H., "Fluxgate Magnetometers for Outer Planets Exploration," *IEEE Transactions on Magnetics*, vol. MAG–10, 1974, pp. 519–523.

Ripka, Pavel, "Review of Fluxgate Sensors," *Sensors and Actuators A*, (1992), pp 129–141.

Ripka, Pavel, "Race–Track Fluxgate Sensors," *Sensors and Actuators; A*, 37–37 (1993), pp 417–421.

Ripka, Pavel, K. Draxler, P. Kaspar, "Race–Track Fluxgate Gradiometer," *Electronic Letters*, 29 (1993), pp 1193–1194.

Ripka, Pavel, "Magnetic Sensors for Industrial and Field Applications," *Sensors and Actuators A*, 42 (1994), Nos. 1–3, pp 394–397.

Ripka, Pavel, F. Primdahl, I.V. Nielsen, J.R. Petersen, A. Ranta, "AC Magnetic Field Measurement Using the Fluxgate," *Sensors and Actuators A*, 46–47 (1995), pp 307–311.

Ripka, Pavel, P. Kaspar, "Portable Fluxgate Magnetometer," *Sensors and Actuators A*, 68 (1998), pp 286–289.

Russell, C.T., "The ISEE 1 and 2 Fluxgate Magnetometers," orig. in *Transactions on Geoscience Electronics*, vol. GE–16, No. 3, Jul. 1978; http://www–ssc.igpp.ucla.edu/personnel/russell/papers/ISEE_fluxgate/ (Feb. 4, 2000).

Russell, C.T., R.C. Snare, J.D.Means and R.C. Elphic, "Pioneer Venus Orbiter Fluxgate Magnetometer," orig. in *IEEE Transactions on Geoscience and Remote Sensing*, GE–18, 32–36, 1980; http://www–ssc.igpp.ucla.edu/personnel/russell/papers/Venus_fluxgate/ (Feb. 4, 2000).

Snare, Robert C., "A History of Vector Magnetometry in Space," Institute of Geophysics and Planetry Physics, University of California, Los Angeles; http://www–ssc.igpp.ucla.edu/personnel/russell/ESS265/History.html; (Feb. 4, 2000) http://www–ssc.igpp.ucla.edu/personnel/russell/ESS265/ess265_res01.GIF; http://www–ssc.igpp.ucla.edu/personnel/russell/ESS265/ess265‾res02.GIF; http://www-ssc.igpp.ucla.edu/personnel/russell/ESS265/ess265_res03.GIF; htpp://www–ssc.igpp.ucla.edu/personnel/russell/ESS265/ess265_res04.GIF; http://www–ssc.igpp.ucla.edu/personnel/russell/ESS265/ess265_res05.GIF; http://www–ssc.igpp.ucla.edu/personnel/russell/ESS265/ess265_res.06.GIF; http://www–ssc.igpp.ucla.edu/personnel/russell/ESS265/ess265_res.07.GIF; htpp://www–ssc.igpp.ucla.edu/personnel/russell/ESS265/ess265_res08.GIF; http://www–sscigpp.ucla.edu/personnel/russell/ESShttp://www–ssc.igpp.ucla.edu/personnel/russell/ESS265/ess265_res09.GIF; http://www–ssc.igpp.ucla.edu/personel/russell/ESS265/ess265_res10.GIF;http://www–ssc.igpp.ucla.edu/personnel/russell/ESS265/ess265_res11.GIF; http://www–ssc.igpp.ucla.edu/personnel/russell/ESS265/ess265_res12.GIF; http://www–ssc.igpp.ucla.edu/personnel/russell/ESS265/ess265_res13.GIF; http://www–ssc.igpp.ucla.edu/personnel/russell/ESS265/ess265_res14.GIF; http://www–ssc.igpp.ucla.edu/personnel/russell/ESS265/ess265_res15.GIF; http://www–ssc.igpp.ucla.edu/personnel/russell/ESS265/ess265_res16.GIF; http://www–ssc.igpp.ucla.edu/personnel/russell/ESS265/ess265_res17.GIF; (Feb. 4, 2000).

Ripka, Pavel, M. Tondra, J. Stokes and R. Beech, "AC–Driven AMR and GMR Magnetoresistors," *Sensors and Actuators A* (1999), vol. 76, pp. 227–232; attached copy is pdf version, observed at some time in 2000 at "Pavel Ripka's Homepage": http://measure.feld.cvut.cz/usr/staff/ripka/ripka_e.htm.

Ripka, Pavel, S.W. Billingsley, "Crossfield Effect at Fluxgate," *Sensors and Actuators* (2000), vol. 81, Nos. 1–3, pp. 176–179; attached copy is pdf version, observed at some time in 2000 at "Pavel Ripka's Homepage": http://measure.feld.cvut.cz/usr/staff/ripka/ripka_e.htm.

Ripka, Pavel and F. Primdahl, "Tuned Current–Output Fluxgate," accepted for publication in *Sensors and Acuators A* (2000); attached copy is pdf preprint, observed at some time in 2000 at "Pavel Ripka's Homepage": http://measure.feld.cvut.cz/usr/staff/ripka/ripka_e.htm.

Ripka, Pavel, "New Directions in Fluxgate Sensors," accepted for publication in JMMM (2000); attached copy is pdf preprint, observed at some time in 2000 at "Pavel Ripka's Homepage": http://measure.feld.cvut.cz/usr/staff/ripka/ripka_e.htm.

Ripka, Pavel, "Race–Track Fluxgate with Adjustable Feedthrough," accepted for publication in *Sensors and Actuators A* (2000); attached copy is pdf preprint, observed at some time in 2000 at "Pavel Ripka's Homepage": http://measure.feld.cvut.cz/usr/staff/ripka/ripka_e.htm.

Ripka, Pavel, P. Kaspar, P. Navratil, A. Tipek, K. Svabova, "Fluxgate Magnetopneumography," Imeko World Congress, Osaka 1999; attached copy is pdf preprint, observed at some time in 2000 at "Pavel Ripka's Homepage": http://measure.feld.cvut.cz/usr/staff/ripka/ripka_e.htm Please note: the fourth of five pages could not be successfully printed out and hence is missing from the attached copy.

Ripka, Pavel, S. Kawahito, "Processing of the Fluxgate Output Signal," Imeko World Congress, Osaka 1999; attached copy is pdf preprint, observed at some time in 2000 at "Pavel Ripka's Homepage": http://measure.feld.cvut.cz/usr/staff/ripka/ripka_e.htm.

Ripka, Pavel, "Magnetic Sensors for Traffic Control," ISMCR 1999; attached copy is pdf preprint, observed at some time in 2000 at "Pavel Ripka's Homepage": http://measure.feld.cvut.cz/usr/staff/ripka/ripka_e.htm.

Kaspar, P, Pavel Ripka, "Induction Coils: Voltage Versus Current Output," Imeko World Congress, Vienna 2000; attached copy is pdf preprint, observed at some time in 2000 at "Pavel Ripka's Homepage": http://measure.feld.cvut.cz/usr/staff/ripka/ripka_e.htm.

Ripka, Pavel, P. Kaspar, A. Tipek, K. Szabova, "Magnetic Lung Diagnostics Using Fluxgate," Imeko World Congress, Vienna 2000; attached copy is pdf preprint, observed at some time in 2000 at "Pavel Ripka's Homepage": http://measure.feld.cvut.cz/usr/staff/ripka/ripka_e.htm.

\* cited by examiner

SPATIALLY INTEGRATING FLUXGATE MANETOMETER HAVING A FLEXIBLE MAGNETIC CORE

CROSS-REFERENCE TO RELATED APPLICATIONS

This application claims the benefit of U.S. provisional application no. 60/123,176, filed Mar. 5, 1999, hereby incorporated herein by reference, entitled "Integrating Fluxgate Magnetometer and Spatially Integrating Magnetometer."

This application is related to U.S. nonprovisional application No. 09/262,932, filed Mar. 5, 1999, now U.S. Pat. No. 6,344,743 B1, hereby incorporated herein by reference, entitled "standing Wave Magnetometer," joint inventors John J. Holmes and John F. Scarzello.

This application is related to U.S. nonprovisional application No. 09/517,558, filed Mar. 2, 2000, now U.S. Pat. No. 6,278,272 B1, hereby incorporated herein by reference, entitled "Integrating Fluxgate Magnetometer," joint inventors John F. scaraello, John J. Holmes and Edward C. O'Keefe.

This application is related to U.S. nonprovisional application No. 09,517,559, filed Mar. 2, 2000, hereby incorporated herein by reference, entitled "Fluxgate Magnetic Field Sensor Incorporating Ferromagnetic Test Material into Its Magnetic Circuitry," joint inventors John P. scarzello, John J. Holmes and Edward C. O'Keefe.

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present inventions relate to methods, systems and apparatuses for performing measurement pertaining to magnetic field, more particularly to such methods, systems and apparatuses for measuring one or more components of a magnetic field over a linear region.

Ships and submarines are constructed of ferromagnetic materials which produce magnetic field signatures, making them detectable and vulnerable to magnetic influence sea mines and detectable by airborne magnetic anomaly detection (MAD) and underwater electromagnetic surveillance systems.

To reduce the magnetic field signature of ships and submarines, coils are wrapped around the ferromagnetic hull, and fields produced which reduce the vessel's signature. In order to control the coil currents, a degaussing (DG) system must have sensors which accurately measure the signature related magnetic fields, and control algorithms to extrapolate the spatially measured field values to regions under the ship, and adjust the coil currents to minimize the signature amplitude.

It is useful to measure magnetic fields near the hull of naval ships and submarines, so that such measured magnetic fields can be used to control advanced degaussing systems. A large number of "point" sensors are presently employed, but they are expensive and not capable of satisfying the need for measuring fields at all points along the circumference of a ship or submarine hull. It is important to measure these fields produced by local hull anomalies (welds, stresses, bulkheads, etc.) and material inhomogeneities at many locations, for more effective control of the ship's degaussing system. Ideally, by measuring the surface magnetic fields all over the hull (and thereby continuously monitoring the magnetic state of a ship or submarine hull), the magnetic field signature of the ship can be adjusted and maintained at a low level using an advanced degaussing system such as the U.S. Navy's Advanced Closed Loop Degaussing System, thereby making a ship less vulnerable to sea mine magnetic influence fuzes.

Advanced degaussing systems require accurate and spatially distributed magnetic field measurements around the ship, so that ship mathematical model algorithms can precisely control magnetic field signatures below the ship. Some of the problems associated with measuring these fields include: large spatial gradient magnetic fields; local magnetic anomalies; induced magnetic fields caused by heading changes; and, permanent magnetization changes due to pressure-induced hull stresses. Such measurements have been made using traditional fluxgate magnetometers, short baseline gradiometers, etc.

In some cases, there are large spatial magnetic field gradients, close to the hull, which are produced by local hull anomalies (e.g., welds, stresses, bulkheads, etc.) and material inhomogeneities. "Point" triaxial fluxgate magnetometers and gradiometers are presently used to measure these spatial gradients; however, because of these local effects, field measurements at many locations may not be useful for controlling the shipboard degaussing system.

Fluxgate magnetometers measure the magnetic field intensity using a variety of transducer cores which, normally, are considered to be small "point" field sensors (typically, about one to two inches in length). More generally, fluxgate, fiber-optic and other magnetic field sensitive transducer phenomena measure the magnetic field intensity using a variety of transducer cores which are normally considered point field measurements (wherein the transducers are typically about one to two inches in length).

Pertinent background information is provided by the following papers, each of which is hereby incorporated herein by reference: Lenz, J. E., "A Review of Magnetic Sensors," *IEEE Proceedings*, Vol. 78, No. 6, June 1990; Gordon, D. I., R. E. Brown and J. F. Haben, "Methods for Measuring the Magnetic Field," *IEEE Trans. Mag.*, Vol. Mag-8, No. 1, March 1972; Gordon, D. I. and R. E. Brown, "Recent Advances in fluxgate Magnetometry," *IEEE Trans. Mag.*, Vol. Mag-8, No. 1, March 1972; Gordon, D. I., R. H. Lundsten, R. A. Chiarodo, H. H. Helms, "A Fluxgate Sensor of High Stability for Low Field Magnetometry," *IEEE Transactions on Magnetics*, vol. MAG-4, 1968, pp 379–401; Acuna, M. H., "Fluxgate Magnetometers for Outer Planets Exploration," *IEEE Transactions on Magnetics*, vol. MAG-10, 1974, pp 519–23.

SUMMARY OF THE INVENTION

In view of the foregoing, it is an object of the present invention to provide method, apparatus and system for measuring magnetic field distribution in a sector of interest—e.g., a distance, an area or a volume—which includes a plurality of different spatial points (i.e., discrete locations in space).

It is another object of the present invention to provide such method, apparatus and system which are more efficient than conventional methods, apparatuses and systems.

It is a further object of this invention to provide such method, apparatus and system which are more economical than conventional methods, apparatuses and systems.

It is another object of this invention to provide such method, apparatus and system which are more reliable than conventional methods, apparatuses and systems.

Another object of the present invention to provide method, apparatus and system for continuously measuring same, for use in association with a magnetic control system such as a ship degaussing system.

According to many inventive SIM embodiments, a spatially integrating transducer magnetometer measures the magnetic field components (tangential and normal) over a very long linear region, at discrete points, and integrates component field values (the sum of the field component amplitudes) over the length of the spatially integrating tranducer magnetometer's sensor element. A typical Spatially Integrating Magnetometer (SIM) measures the magnetic field at discrete distributed points, or summation of all field components, along a "linear" transducer element. A typical inventive SIM: (i) measures magnetic field amplitude components over a very long linear region, at discrete points, and (ii) integrates these component field values (the sum of the field component amplitudes) over the length of the transducer element. An "integrating" fluxgate transducer magnetometer measures the magnetic field amplitude component over a linear region, and "integrates" the measured values to obtain the sum of the field component amplitudes over the length of the fluxgate transducer magnetometer's sensor element. An SIM measures the magnetic field at discrete distributed points, or summation of all field components, along a "linear" transducer element.

Certain conventional fluxgate magnetometers implement a magnetic core having a "closed" (or "closed loop") configuration; that is, the shape of the magnetic core describes a geometrically closed figure. In other words, a closed magnetic core has a closed magnetic flux path. Two closed core configurations which are known in the art are the "ring core" and the "racetrack core" configurations. See, e.g., the following references, each of which is incorporated herein by reference: Pavel Ripka, "Review of Fluxgate Sensors," *Sensors and Actuators A*, 33 (1992), pp 129–141; Pavel Ripka, "Race-Track Fluxgate Sensors," *Sensors and Actuators*; A, 37–38 (1993), pp 417–421; Pavel Ripka, Draxler K, Kaspar P., "Race-Track Fluxgate Gradiometer," *Electronic Letters*, 29 (1993), pp 1193–1194; Pavel Ripka, "Magnetic Sensors for Industrial and Field Applications," *Sensors and Actuators A*, 42 (1994), nos. 1–3, pp 394–397; Pavel Ripka, F. Primdahl, I. V. Nielsen, J. R. Petersen, A. Ranta, "AC Magnetic Field Measurement Using the Fluxgate," *Sensors and Actuators A*, 46–47 (1995), pp 307–311; Pavel Ripka, P. Kaspar, "Portable Fluxgate Magnetometer," *Sensors and Actuators A*, 68 (1998), pp 286–289.

The National Aeronautics and Space Administration and the Naval Surface Warfare Center, White Oak (now closed) have developed ring core fluxgate magnetometers; see, e.g., the above-mentioned references Gordon, D. I. and R. E. Brown, "Recent Advances in Fluxgate Magnetometry," *IEEE Trans. Mag.*, Vol. Mag-8, No. 1, March 1972; Gordon, D. I., R. H. Lundsten, R. A. Chiarodo, H. H. Helms, "A Fluxgate Sensor of High Stability for Low Field Magnetometry," *IEEE Transactions on Magnetics*, vol. MAG-4, 1968, pp 379–401; Acuna, M. H., "Fluxgate Magnetometers for Outer Planets Exploration," *IEEE Transactions on Magnetics*, vol. MAG-10, 1974, pp 519–23.

It is noted that the conventional ring core and racetrack core magnetometers basically accomplish the same purpose, viz., to measure the magnetic field existing at a point in space rather than along a significant distance in space. The conventional racetrack core is essentially a slightly elongated ring core, having a moderately oval shape. A conventional ring core and a conventional racetrack core can each be considered to have a length L and a diameter D. A conventional ring core has a length-to-diameter ratio L/D of approximately one. A conventional racetrack core has a length-to-diameter ratio L/D of greater than one but no greater than about four. Depending on the application, there may be advantages associated with either the ring core or racetrack core; nevertheless, until the present invention, neither magnetometer design has been considered for implementation as anything other than "point" sensors.

By contrast, the present invention uniquely features an extremely elongate closed core having the associated benefit of rendering significantly more expansive magnetic field measurements than mere "point" measurements. In essence, the inventive core is an exceedingly stretched ring core which approximately defines a very elongate racetrack (oval) geometry. The oblong inventive core typically comprises two approximately parallel rectilinear (e.g., approximately linear) side core sections and two curvilinear (e.g., arcuate) end sections.

In accordance with many embodiments of the present invention, a fluxgate magnetometer comprises a slender flexible magnetic core, two drive windings and a sense winding. The magnetic core is characterized by a closed magnetic flux path, a core length, a core width and a ratio of the core length to the core width of at least ten. The magnetic core has two approximately equal lengthwise core portions and two arcuate end portions. The lengthwise core portions are longitudinally contiguously joined. Each lengthwise core portion is characterized by approximately the same lengthwise core portion length, which is substantially the core length. Each drive winding is wound over one lengthwise core portion. The sense winding is wound encompassingly with respect to the combination of the two lengthwise core portions and the two drive windings. Typically, the fluxgate magnetometer is adaptable to transmitting, via the sense winding, an electrical signal which is integratively indicative of the sensed magnetic field components over the lengthwise core portion length.

The inventive fluxgate magnetometer can be thought of as a parallel-gated fluxgate magnetometer having configurational indicia both of a rod-core (two-core) fluxgate magnetometer and a ring-core magnetometer. Like a rod-core sensor, the inventive sensor includes two straight parallel core sections; like a ring-core sensor, the entire inventive core is "closed," wherein the two straight parallel core sections are connected at their respective ends by two curved "end-loop" core sections, thereby closing the drive flux path.

As distinguished from conventional racetrack cores, the inventive cores have a length L and a diameter D wherein the length-to-diameter ratio L/D is at least ten and more typically much greater than ten. For instance, the U.S. Navy's prototype IFM sensor has a length-to-diameter ratio L/D of approximately thirty. According to this invention, the inventive SIM has a length-to-diameter ratio which (depending on the embodiment) potentially is ten or a hundred or a thousand or even a million. In essence, the inventive magnetic core describes an exceedingly extended ring core transducer geometry. The extremely elongate shape of the present invention's core beneficially affords magnetometric sensing which equates to an "averaging" of the magnetic field over a significant distance, viz., the length L of the core. The inventive sensor, when used in the normal fashion of a parallel-gated fluxgate magnetometer, automatically operates so as to "integrate" the sensed values of the magnetic field aver the length L of the core.

Since the conventional racetrack core geometry has such a low L/D ratio (less than or approximately equal to four), it yields measurements which, for all practical purposes, are "point" measurements; indeed, the conventional wisdom has never attributed anything other than a "point" measurement to any fluxgate magnetometer. By comparison, the racetrack core geometry according to the present invention has a sufficiently high L/D ratio (greater than or approximately equal to ten) so that it yields measurements which, for all practical purposes, are true "multi-point" or "line" measurements. According to this invention, the magnetic field components are spatially integrated.

Thus featured by the present invention is a naturally occurring mathematically integrative function which advantageously serves to minimize the magnetic field measurement perturbations associated with anomalous portions of the region of interest, thereby more accurately assessing the magnetic field over the expanse of such region. Moreover, intrinsic to the inventive core's high L/D ratio is the invention's valuable potentiality for providing such core so as to be characterized by a very long core length L, practically approaching infinite length L. In other words, extremely great surface lengths and areas of entities can be integratively sensed by the present invention.

Related to (but distinguishable from) the inventive SIM is the inventive "Integrating Fluxgate Magnetometer" (IFM) which is disclosed by the aforementioned U.S. nonprovisional patent application No. 09/517,558. A typical inventive Integrating Fluxgate Magnetometer (IFM) is a fluxgate magnetometer having a rigid transducer core which is configured as a long "race track" in order to integrate large component gradient magnetic field near a ferromagnetic entity, e.g., a ship hull or a large piece of machinery. A typical inventive IFM: (i) measures magnetic fields over the length of its elongated transducer element (e.g., the 30 cm length of an inventive prototype tested by the U.S. Navy), and (ii) spatially integrates the component field amplitudes.

Also related to (but distinguishable from) the inventive SIM is the inventive "Ferromagnetic Surface Magnetic Field Sensor" (FSMFS) which is disclosed by the aforementioned U.S. nonprovisional patent application No. 09/517,559. Typically, the inventive HTS uses the ferromagnetic material of the measured entity as part of the transducer core in order to determine the magnetic characteristics of the measured entity. For instance, in a typical marine application, an inventive HTS uses the ferromagnetic ship hull material am part of the transducer core to determine its magnetic characteristics.

Also related to (but distinguishable from) the inventive SIM is the inventive "Standing Wave Magnetometer" (SWM) which is disclosed by the aforementioned U.S. Pat. No. 6,344,743 B1. In accordance with many embodiments of the inventive SWM, a methodology is provided for determining the distribution of a magnetic field in a spatial sector. According to a typical inventive SWM, a magnetic field amplitude value is measured at each of a plurality of points in the sector, wherein the means for measuring is characterized by a length which is defined by the points. Alternating current is applied at a high frequency having an associated wavelength which corresponds to a multiple of the length. The applied alternating current is conducted so as to establish a standing wave along the length. The measured magnetic field amplitude values are processed; this processing includes performing, over the multiple of the length, Fourier analysis based on a harmonic bias function which results from the standing wave.

The inventive SIM and the inventive IFM are similar, but differ in certain respects. According to many preferred inventive SIM embodiments, the inventive SIM basically represents an extension of the inventive IFM principal, but significantly departs from the inventive IFM transducer in terms of physical characteristics (e.g., rigidity versus flexibility), configuration, dimensions and adaptability. The IFM is typically rigid. The inventive SIM is typically characterized by flexibility rather than rigidity and is typically much longer than the inventive IFM. Moreover, the inventive SIM is often characterized by greater complexity than is the inventive IFM, since the lengthy, flexible SIM can propitiously be associated with other sensors of various kinds.

The SIM according to this invention features a closed geometry magnetic core comprising a flexible (rather than rigid) core bobbin structure and an amorphous magnetic material which covers this flexible bobbin structure. Moreover, the inventive SIM features a closed magnetic core having two parallel magnetic core sections which are contiguously disposed in relation to each other. Essentially, the two parallel magnetic core sections are connected to each other at their respective ends, and are contiguously united to form a single, lengthy magnetic transducer characterized by a closed magnetic flux path.

An inventive IFM typically has an oblong-shaped bobbin core of rigid construction, wherein there is a space or separation between essentially linear sections of the bobbin core. On the other hand, an inventive SIM has a flexible construction wherein there is no space or separation between essentially linear sections of the bobbin core; that is, they are adjacent or contiguous. Like an inventive IFM, an inventive SIM is characterized by functionality of a closed core and by geometric indicia of an elongate "racetrack" core. Both an inventive IFM and an inventive SIM will typically be implemented so as to be at least slightly set apart (distanced) from the surface of the ferromagnetic material being sensed. A typical inventive SIM, however, is made to be much longer than a typical IFM.

In accordance with many embodiments of the present invention, fluxgate apparatus, for sensing the magnetic field of a ferromagnetic entity, comprises a flexible magnetic core, drive winding means and sense winding means. The flexible magnetic core defines a closed magnetic flux path and at least substantially describes an elongate solid shape. The magnetic core has two longitudinal linear segments and two curvilinear segments. The two longitudinal linear segments are a first longitudinal linear segment and a second longitudinal linear segment. The first longitudinal linear segment and the second longitudinal linear segment have the same length and are adjacently coupled along their length. The magnetic core has a width across the adjacently coupled first longitudinal linear segment and second longitudinal linear segment. The width is no greater than ten percent of the length. The drive winding means includes a first drive winding and a second drive winding. The first drive winding is wound on the first longitudinal linear segment. The second drive winding is wound on the second longitudinal linear segment. The sense winding means including a sense winding which is wound so an to surround both the first drive winding and the second drive winding. Typically, the fluxgate apparatus is capable of generating an output signal which is detectable through connection with the sense winding, and wherein the output signal represents the integration of magnetic field components over the length.

The inventive SIM can have practically unlimited extent for covering very large ferromagnetic areas and entities. The SIM's magnetic core is typically made to be flexible so as to be capable of being conformally disposed along great distances of the ferromagnetic material being sensed. In effect, the SIM admits of neighboring, bordering or "lining" virtually anything of virtually any length. The SIM is typically embodied as a continuous narrow, flexible strip having a conjoined double-core configuration wherein the two flexible magnetic cores are longitudinally coupled so as to form a single flexible transducer. The SIM lends itself to being disposed at great distances like a tape, wire or cable.

There are numerous possible inventive applications wherein can be used, in accordance with the inventive principles of an SIM or IFM, a distributed integrating magnetic field sensor. Examples of military applications include underwater-based (e.g., as part of an underwater submarine barrier array, in naval mines, etc.) and land-based intrusion detection systems. Examples of commercial applications include geophysical prospecting (e.g., for minerals) and other physical studies. Another potential commercial application of either the inventive SIM or the inventive IFM is in the realm of traffic control (e.g., multi-lane vehicle detection). There are numerous applications of the inventive SIM wherein a large linear magnetic field sensor could be used, including underwater surveillance barriers and land based intrusion detection systems. The inventive SIM could also be used commercially for vehicle detection in traffic control systems, and in both internal and perimeter security systems. In general, the inventive SIM and the inventive IFM share many potential applications.

The "Spatially Integrating Magnetometer" ("SIM") according to this invention accomplishes "spatial" integration of measured magnetic field over a great distance. The U.S. Navy considered accomplishing same, using inventive principles, by enhancing a conventional array of "point" magnetometers. According to an inventively "enhanced" conventional approach, these measured fields would be "spatially" integrated.

A traditional spatial magnetometer array measures fields at numerous points along the hull. For instance, according to a traditional spatial magnetometer measurement array concept such as is utilized for distributed underwater surveillance sensors, "point" sensors can be located in a spatial array with electrical voltages corresponding to magnetic field component values telemetered to a central processing location. Triaxial magnetometers embedded in a cable can be used, and the cable can be used to power and communicate the measured data.

Hence, in accordance with inventive principles, an inventively enhanced traditional spatial magnetometer array (such as shown in FIG. 7-1 of the below-mentioned U.S. Navy technical report NSWCCD-TR-98/011 by John F. Scarzello and Edward C. O'Keefe) could be used to measure fields at numerous points along the hull and be "spatially" integrated. The traditional spatial magnetometer measurement array concept could inventively be rendered more efficient and adapted to inventive "integrative" purposes using present electronics and telemetry technology; however, its cost, size, durability and telemetry system expandability may limit its use in advanced degaussing systems. The "Spatially Integrating Magnetometer" ("SIM") in accordance with the presents invention provides a better methodology for spatially" integrating measured magnetic fields over great expanses and extents.

Other objects, advantages and features of this invention will become apparent from the following detailed description of the invention when considered in conjunction with the accompanying drawings, Incorporated herein by reference in the following technical report: Scarzello, John P. and Edward C. O'Keefe, "Development of Shipboard Magnetic Sensors for Degaussing System Controllers," NSWCCD-TR-98/011, Jun. 30, 1998, Machinery Research and Development Directorate Research and Development Report, Naval Surface Warfare Center, Carderock Division, West Bethesda, Md. 20817-5700. See, especially, Chapter 7 of this report. This report includes 93 pages, including 43 pages of drawings.

BRIEF DESCRIPTION OF THE DRAWINGS

In order that the present invention may be clearly understood, it will now be described, by way of example, with reference to the accompanying drawings, wherein like numbers indicate the same or similar components, and wherein.

DETAILED DESCRIPTION OF THE INVENTION

Fluxgate magnetometers have been developed to measure magnetic fields since the late 1930's. They use a ferromagnetic material as the transducer element, which is cyclically driven into saturation, which controls the flux in the core. To measure the controlled flux-driven core plus that provided by the external or ambient magnetic field, the field-dependent induced second harmonic signal of the saturated core is measured, and compared to the second harmonic of the drive signal, the amplitude of which is proportional to the ambient field intensity, with phase corresponding to field polarity.

In frequently preferred inventive practice, the inventive "Spatially Integrating Magnetometer" ("SIM") is a sort of fluxgate magnetometer. The inventive SIM utilizes a principle of the fluxgate magnetometer, but typically applies it to a very long amorphous soft magnetic material transducer core, which could have dimensions of tens to hundreds (or even thousands) of feet. The inventive SIM fluxgate magnetometer uses an amorphous ferromagnetic material as the transducer element, which is quite immune to mechanical induced changes to its magnetic properties. The core is driven into saturation, which controls the flux in the core, which measures the drive flux plus that provided by the external or ambient magnetic field. The second harmonic field dependent signal induced in the saturated core is measured, and compared to the second harmonic of the drive signal, whose amplitude is proportional to the ambient field intensity, with phase corresponding to field polarity.

According to many preferred embodiments, the inventive "Spatially Integrating Magnetometer" ("SIM") basically represents in principle an extension or variation of the inventive "Integrating fluxgate Magnetometer" (IFM), but significantly departs therefrom in certain respects.

Figure 1:
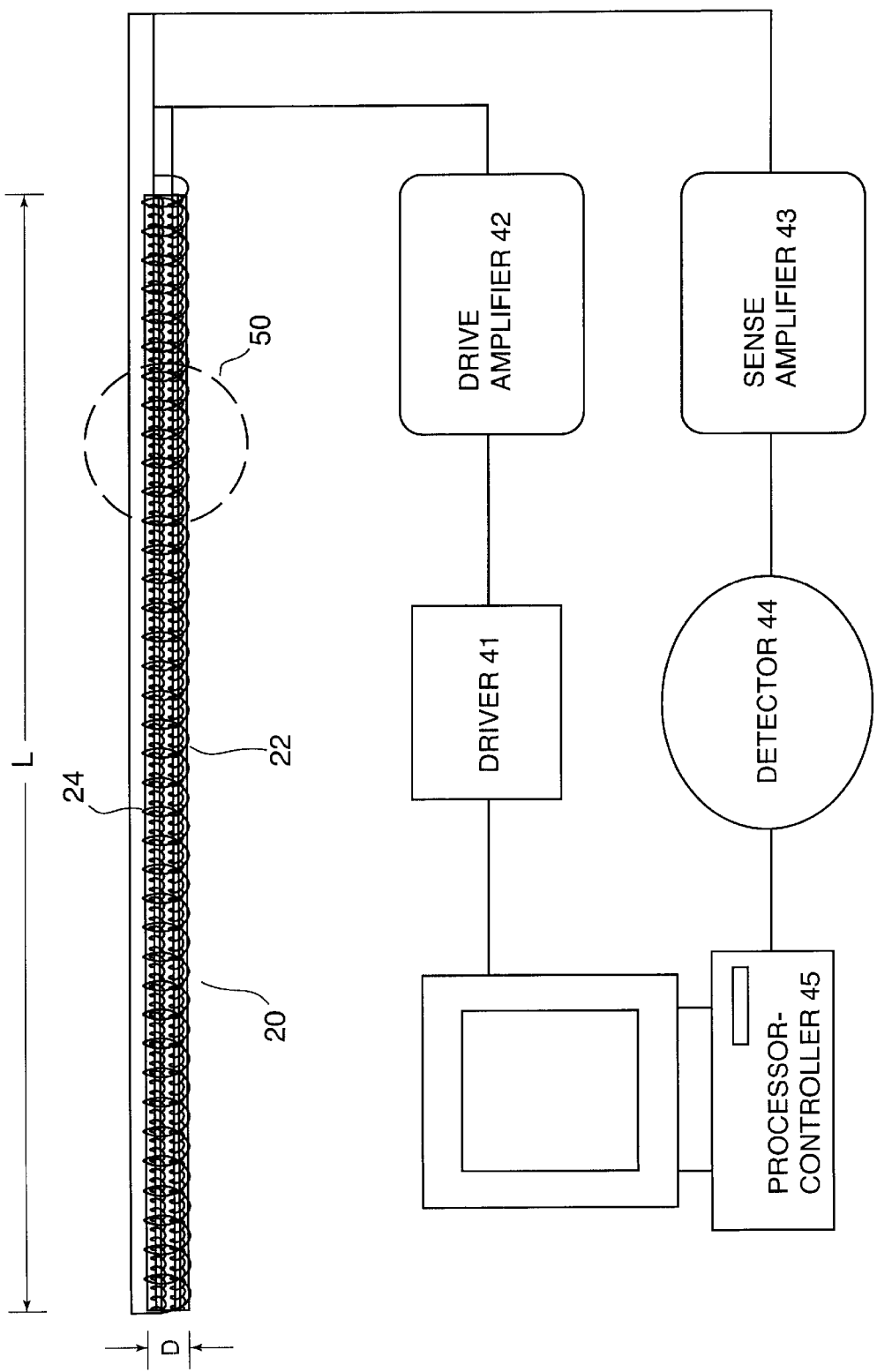
FIG. 1 is a diagrammatic and schematic view of an embodiment of an inventive "Spatially Integrating Magnetometer" ("SIM") and associated electronics, wherein the SIM transducer core is depicted as an elongate "race track" core (closed magnetic flux path) with integrating sense winding on the entire length of the core material. The SIM shown is representative of a U.S. Navy prototype thereof.
Figure 3:
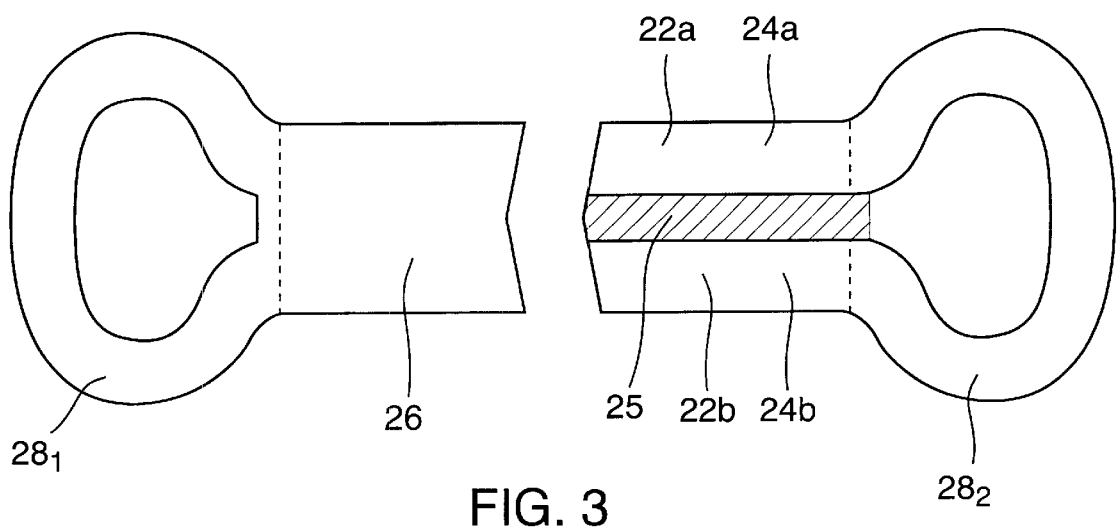
FIG. 3 is a diagrammatic perspective view of a drive-wound and sense-wound SIM transducer core having an overall "tape" configuration, representative of a U.S. Navy prototype thereof.
Figure 2:
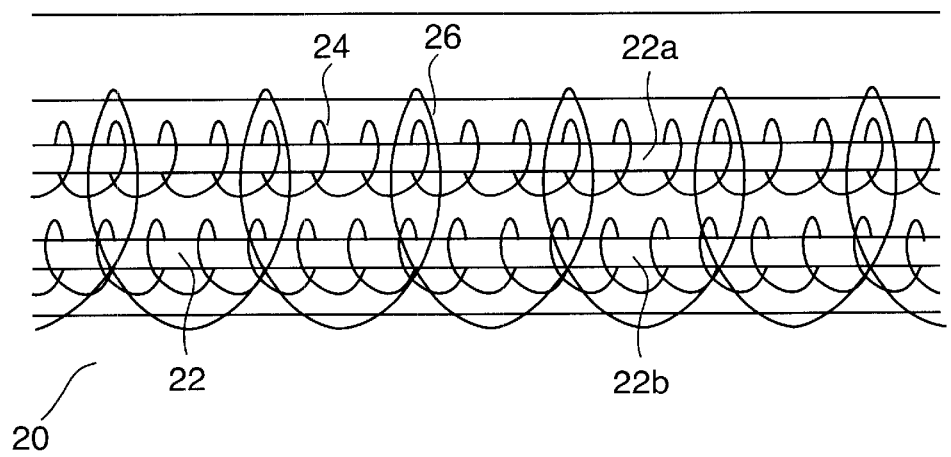
FIG. 2 is an enlarged and partial view of the drive winding, sense winding and SIM transducer core shown in FIG. 1.

Referring now to FIG. 1, FIG. 2 and FIG. 3, inventive SIM 20 has magnetic transducer core 22 which is "racetrack" in character; that is, magnetic core 22 defines a closed magnetic flux path. Although core 22 describes a "closed" configuration, its construction has indicia of a closely coupled double-core. Core 22 has a very high length/diameter (LLD) ratio—depending on the inventive embodiment, at least about 10 and potentially much, much higher (e.g., in the hundreds or thousands). For substantially the entire length L of core 22, two "semi-sections" of core 22 are longitudinally adjoining.

SIM 20 comprises two parallel amorphous material "semi-section" cores 22a and 22b, each comprising approximately ten wraps of "tape" or "wire" core; the U.S. Navy used tape-like cores 22a and 22b in testing. The two cores 22a and 22b are each separately and directly wound with a drive winding, viz., drive windings 24a and 24b, respectively. Then, cores 22a and 22b are joined along their respective lengths using a non-magnetic binder 25 (adhesive tape, silicone rubber adhesive, etc.). For example, a layer of non-magnetic binder 25 can be situated between core 22a and 22b in sandwich fashion along their respective lengths.

Drive winding-wound cores 22a and 22b are then wound with a continuous sense winding 26, which senses the field dependent second harmonic signal generated over the entire length of the cores 22a and 22b. In other words, sense winding 26 is directly wound over the combination of cores 22a and 22b and drive windings 24a and 24b. According to some inventive embodiments, sense winding 26 can also be used for "feedback" purposes in association with system electronics. According to other inventive embodiments, a separate feedback winding 27 can be wound over sense winding 26.

Core 22 represents a kind of flexible double-core construction wherein its two flexible drive-wound semi-section cores are proximately and securely united lengthwise and are sense-wound thereover. Integrating sense winding 26 is wound on virtually the entire length of the cores 22a and 22b material. As especially illustrated in FIG. 3, SIM 20 overall has a tape-like flexible construction which lends itself to being placed over extensive areas in linear and/or curved paths. The part of SIM 20 representing the coupling of cores 22a and 22b has a sort of flexible "narrow strip" or "tape" form, wherein each of cores 22a and 22b itself has a sort of flexible "tape" or "wire" form.

SIM 20 can moderately bend and thereby angularly or curvilinearly conform with respect to the surface areas of ferromagnetic objects of diverse sizes and/or geometries. Core ends $28_1$ and $28_2$ are loops of core 22 material comprising end portions of cores 22a and 22b. The "loopedness" of core ends $28_1$ and $28_2$ is necessitated by the fact that the core 22 material has limited bendability; hence, the sense winding of the union of the drive-wound cores 22a and 22b is effected so that "room" be left at the ends of cores 22a and 22b in order to maintain magnetic closure (i.e., retain the "racetrack" character) of core 22. While the main reason for the existence of the core ends $28_1$ and $28_2$ is that SIM 20 has a "closed" core 22, the "loopy" form defined by core ends $28_1$ and $28_2$ should be heeded by the inventive practitioner. In furtherance of a sort of "symmetry" for magnetic operative integrity of SIM 20, it should generally be preferable inventive practice to make sure that each of core ends $28_1$ and $28_2$ describes approximately the same size and shape.

In accordance with inventive principles, semi-section cores 22a and 22b can be disposed at any of various distances of separation with respect to each other, depending on the embodiment. As shown in FIG. 3, cores 22a and 22b are propinquitously adjacent, separated therebetween by a relatively thin adhesive layer 25. Many inventive embodiments provide for the close coupling of drive-wound cores 22a and 22b, such as shown in FIG. 3, in order to facilitate the functionality of SIM 20 as a versatile, flexible unit. Generally, the diameter (width) D of core 20 should be small enough to advance such functional considerations of the present invention.

Particularly referring to FIG. 1, SIM 20 is in connective relationship with various electronics, including electric driver 41, drive signal amplifier 42 (which is connected to driving winding 24), sense signal amplifier 43 (which is connected to sense winding 26), phase detector 44 and processor-controller 45. The ordinarily skilled artisan is well acquainted with electronic methodologies pertaining to fluxgate magnetometers. In practicing the Navy's prototype SIM, the sense signal amplifier 43 should be designed to expect a certain maximum fundamental amplitude (e.g., 5.8 volts), and be tuned to amplify the second harmonic field dependent signal.

In inventive practice, SIM 20 will generally be positioned so as to be approximately parallel to and at least slightly distanced from the surface of the ferromagnetic material being sensed. The inventive IFM and the inventive FSMFS will each also be at least slightly distanced from the ferromagnetic material surface. According to many applications thereof, SIM 20 will be near, or will border upon, adjoin or hug a sizable extent of the ferromagnetic surface. The inventive SIM typically has an at least moderately flexible construction, since according thereto a sense winding is wound about a longitudinally closely coupled dual arrangement of a pair of drive windings wound about their respective flexible magnetic core portions. According to typical inventive practice, SIM 20 is imbued with sufficient length and flexibility for hugging the rectilinear and/or curvilinear contours of a dimensionally great and varied surface. Neither the inventive IFM, nor the inventive SIM, nor the inventive FSMFS is dimensionally or configurationally unwieldy; in ship applications, the inventive IFM and/or the inventive SIM and/or the inventive HSMFS can be rather facilely integrated with a ship or submarine hull, giving reliable performance without necessitating inordinate amounts of hull penetrations and conductors. The U.S. Navy envisions embedding or incorporating SIM 20 in a relatively thick coating provided on the ferromagnetic hull, whereby SIM 20 adjoins the ferromagnetic hull surface but is proximately separated therefrom. The inventive IFM and the inventive HSFMS can also be embedded in the ship's hull in this manner.

Figure 4:
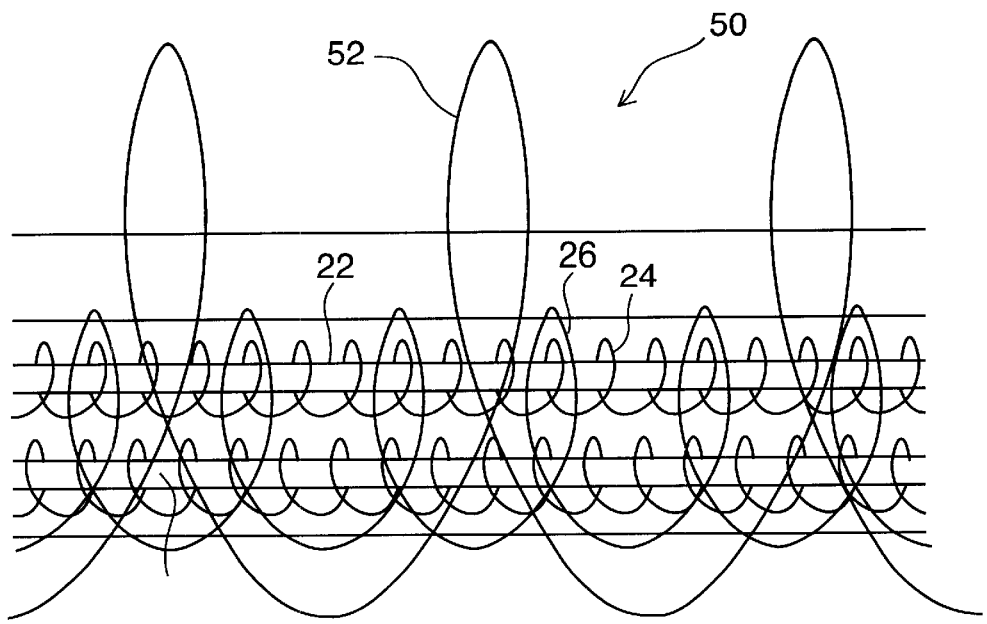
FIG. 4 is a diagrammatic view of a "point" sensor detector, which can be considered to be either a magnetometer or short baseline gradiometer, having its own sense windings wound over the integrated sense winding of the SIM.

Conventional "point" sensors may optionally be used in association with an inventive SIM 20. With reference to FIG. 4, a "point" sensor 50, which can be either a magnetometer or short baseline gradiometer, has sense winding 52 wound over the sense winding 26 of SIM 20. For instance, it is envisioned through consideration of FIG. 4 in conjunction with FIG. 1, that one or more "point" sensors 60 can be provided at various locations of SIM 20, such as indicated by the dashed circle in FIG. 1. Some SIM applications will inventively employ an elongated racetrack (closed magnetic flux path) core 20 and plural sensors 60 in such a way that "point," gradient and integrated field values about a complete loop can be measured simultaneously. It requires each sensor 60 position to be connected to detection electronics (such as including detector 44 and sense amplifier 43) and a data telemetry system (such as including processor-controller 45).

Figure 7:
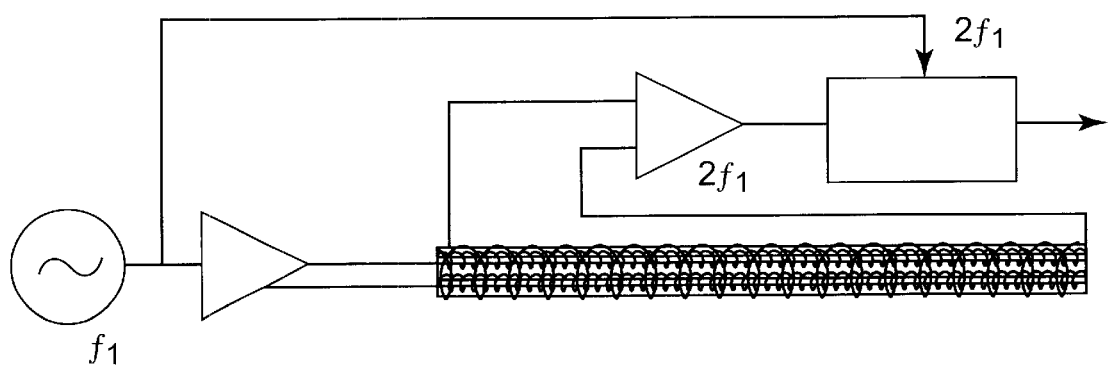
FIG. 7 is a circuit diagrammatic representation of an inventive SIM embodiment such as shown in FIG. 5.
Figure 6:
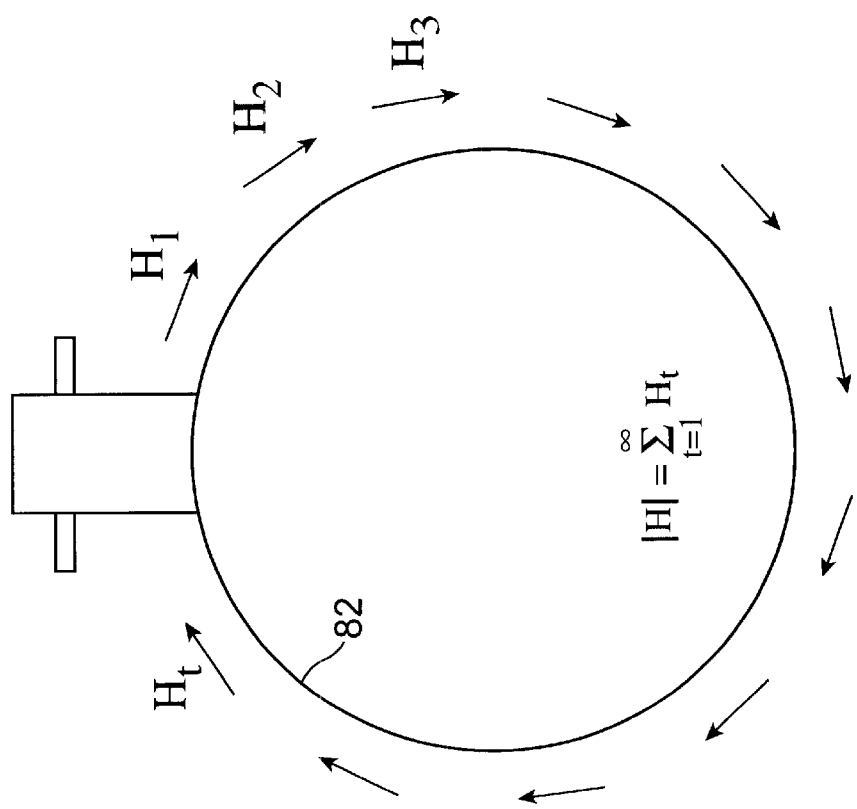
FIG. 6 is a diagrammatic view illustrating how the inventive SIM embodiment shown in FIG. 5 spatially "integrates" the magnetic field amplitude component values over the circumference of the submarine.
Figure 5:
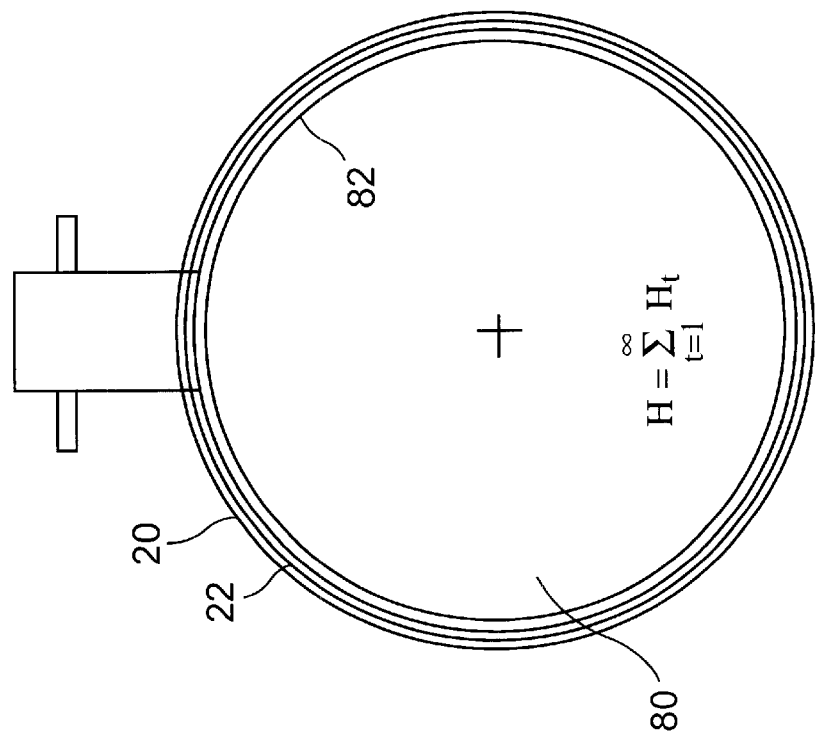
FIG. 5 is a diagrammatic view illustrating how an inventive SIM embodiment having a "racetrack core," such as shown in FIG. 1 might be deployed on a submarine.

Reference is now made to FIG. 5 through FIG. 7, which are diagrammatically illustrative of how an inventive SIM 20 having a racetrack core 22, such as described herein in relation to FIG. 1 through FIG. 4, may be utilized for a submarine. Submarine hull 80 has outer submarine hull surface 82 and is made of a ferromagnetic material. Core 22, huggingly disposed with respect to hull surface 82, encircles the circumference of submarine hull 80.

As illustrated in FIG. 5 and FIG. 6, the inventive SIM 20 having a racetrack core 22 can be configured in a large loop which envelops the ferromagnetic entity being sensed. Other variations of the inventive "single loop" SIM 20 include systems integration, with the drive electronics providing power to distributed sensor nodes, and an embedded fiber-optic cable which serves as a data telemetry link for each self powered node. The inventive SIM fluxgate powered distributed nodes could host special magnetic sensors (such as hull permeameters or thin film gradiometers) or other sensors (such as hydrophones, geophones and strain gauges). Of particular note, the inventive SIM could have embedded therein or otherwise associated therewith at least one inventive "Ferromagnetic Surface Magnetic Field Sensor" ("FSMFS") and/or at least one inventive "Integrating Fluxgate Magnetometer" ("IFM").

Another kind of inventive SIM also lends itself to such "single loop" applications as a possible submarine installation. In addition to an inventive SIM 20 having a racetrack core such as shown in FIG. 1 through FIG. 7, shown in FIG. 7-3 of the above-mentioned U.S. Navy technical report NSWCCD-TR-98/011 by John F. Scarzello and Edward C. O'Keefe is a simpler inventive "Spatially Integrating Magnetometer" concept using a single care which (similarly as shown in FIG, 5) is formed in a large loop which circumferentially encircles submarine hull 80. The single cored SIM transducer has one solenoidal drive winding, one sense winding which senses the hull's tangential field component, and one location to join the core ends (close the drive flux path) and connect the drive and sense windings to the electronics.

The present invention's ability to measure an "integrated" component of magnetic field appears to reduce the field variations associated with local magnetic anomalies. The advantage of using inventive SIM sensor measurement of advanced degaussing systems is currently being examined in the U.S. Navy's Advanced Degaussing Technology program. As contemplated by the U.S. Navy, the inventive SIM will greatly expand the spatial integrating magnetic component field measurement dimensions over the inventive IFM. The size of the inventive SIM is envisioned to be about twenty percent larger than that of RG-8 cable.

As regards both the inventive IFM and the inventive SIM, either of these inventive magnetic sensor systems (i.e., an inventive IFM or an inventive SIM) can be efficaciously (and perhaps preferably) utilized in practicing many embodiments of the novel "standing wave magnetometer" invention which is disclosed in the aforementioned nonprovisional patent application (entitled "Standing Wave Magnetometer") which is being filed concurrently herewith.

In inventive standing wave magnetometer practice, an inventive SIM can be configured for point measurement or for spatially integrating measurement.

For instance, according to some inventive standing wave magnetometer embodiments, an inventive SIM fluxgate sensor can be designed to be the inner conductor of a coaxial cable RF transmission line. A pertinent principle of the inventive standing wave magnetometer would be that, in an RF transmission line, there are magnetic and electric components to a propagating wave; that is, there are maximum and minimum magnetic field components related to the frequency (wavelength) of the standing wave. In inventive fashion, the positions of the maximum and minimum magnetic field amplitudes can be varied so that field measurements can be computed at each point along the cable by varying the frequency in the coaxial transmission line.

According to some inventive standing wave magnetometer embodiments, an inventive SIM configuration can include plural fiber-optic magnetic field sensors using magnetorestrictive materials in a standing wave RF transmission line. Or, some inventive standing wave magnetometer embodiments can include a Faraday rotation detector using a fiber-optic material with a very high Verdet effect; the Faraday fiber-optic wave guide would be part of an RF transmission line.

Other embodiments of the inventions disclosed herein will be apparent to those skilled in the art from a consideration of this disclosure or practice of the invention disclosed herein. Various omissions, modifications and changes to the principles described may be made by one skilled in the art without departing from the true scope and spirit of the invention which is indicated by the following claims.

What is claimed is:

1. A fluxgate magnetometer comprising a slender flexible magnetic core, two drive windings and a sense winding, said magnetic core being characterized by a closed magnetic flux path, a core length, a core width and a ratio of said core length to said core width of at least ten, said magnetic core having two approximately equal lengthwise core portions and two arcuate end portions, said lengthwise core portions being longitudinally contiguously joined, each said lengthwise core portion being characterized by approximately the same lengthwise core portion length which is substantially said core length, each said drive winding being wound over one said lengthwise core portion, said sense winding being wound encompassingly with respect to the combination of said two lengthwise core portions and said two drive windings.

2. The fluxgate magnetometer of claim 1, wherein said fluxgate magnetometer is adaptable to transmitting, via said sense winding, an electrical signal which is integratively indicative of the sensed magnetic field components over said lengthwise core portion length.

3. The fluxgate magnetometer of claim 1, wherein said magnetic core includes amorphous material in a form selected from the group consisting of tape and wire.

4. The fluxgate magnetometer of claim 1, wherein said magnetic core includes amorphous material and is in a tape form.

5. The fluxgate magnetometer of claim 1, wherein said magnetic core includes amorphous material and is in a wire form.

6. The fluxgate magnetometer of claim 1, further comprising a non-magnetic adhesive material for said longitudinal contiguous joining of said two lengthwise core portions.

7. The fluxgate magnetometer of claim 1, further comprising a non-magnetic adhesive material between said two lengthwise core portions.

8. The fluxgate magnetometer of claim 1, wherein said lengthwise core portions are longitudinally contiguously joined so as to describe a narrow strip shape.

9. The fluxgate magnetometer of claim 1, wherein said two arcuate end portions each describe a loop.

10. The fluxgate magnetometer of claim 1, wherein said two arcuate end portions respectively describe approximately congruous loops.

11. The fluxgate magnetometer of claim 1, further comprising a feedback winding which is wound encompassingly with respect to the combination of said two lengthwise core portions, said two drive windings and said sense winding.

12. Fluxgate apparatus for sensing the magnetic field of a ferromagnetic entity, said fluxgate apparatus comprising:

a flexible magnetic core which defines a closed magnetic flux path and which at least substantially describes an elongate solid shape, said magnetic core having two longitudinal linear segments and two curvilinear segments, said two longitudinal linear segments being a first longitudinal linear segment and a second longitudinal linear segment, said first longitudinal linear segment and said second longitudinal linear segment having the same length and being adjacently coupled along said length, said magnetic core having a width across said adjacently coupled said first longitudinal linear segment and said second longitudinal linear segment, said width being no greater than ten percent of said length;

drive winding means including a first drive winding and a second drive winding, said first drive winding being wound on said first longitudinal linear segment, said second drive winding being wound on said second longitudinal linear segment; and sense winding means including a sense winding which is wound so as to surround both said first drive winding and said second drive winding.

13. fluxgate apparatus according to claim 12, wherein said fluxgate apparatus is capable of generating an output signal which is detectable through connection with said sense winding, and wherein said output signal represents the integration of magnetic field components over said length.

14. Fluxgate apparatus according to claim 12, further comprising feedback winding means including a feedback winding which is wound so as to surround said sense winding.

15. Fluxgate apparatus according to claim 12, further comprising:

driver-and-amplification means connected to said first drive winding and said second drive winding, for generating an input signal;

amplification-and-detector means connected to said sense winding, for ascertaining said output signal; and controller-processor means connected to said driver-and-amplification means, said amplification-and-detector means and said feedback winding, for regulating said input signal and said output signal and acquiring information pertaining thereto.

16. Fluxgate apparatus according to claim 12, further comprising a non-magnetic adhesive material for said adjacent coupling of said first longitudinal linear segment and said second longitudinal linear segment.

17. A method for sensing a magnetic field of a ferromagnetic entity, said method comprising:

providing a fluxgate magnetometer which includes a flexible magnetic core, a first drive winding, a second drive winding, and a sense winding, said magnetic core defining a closed magnetic flux path and at least substantially describing an elongate solid shape, said magnetic core having two longitudinal linear segments and two curvilinear segments, said two longitudinal linear segments being a first longitudinal linear segment and a second longitudinal linear segment, said first longitudinal linear segment and said second longitudinal linear segment having the same length and being adjacently coupled along said length, said magnetic core having a width across said adjacently coupled first longitudinal linear segment and said second longitudinal linear segment, said width being no greater than ten percent of said length, said first drive winding being wound on said first longitudinal linear segment, said second drive winding being wound on said second longitudinal linear segment, said sense winding being wound so as to surround both said first drive winding and said second drive winding; and positioning said fluxgate magnetometer so as to be approximately parallel with respect to a surface area of said ferromagnetic entity.

18. A method for sensing a magnetic field as recited in claim 17, further comprising:

driving an input signal for said fluxgate magnetometer, said driving including using said drive winding; and detecting an output signal from said fluxgate magnetometer, said detecting including using said sense winding.

19. A method for sensing the magnetic field as recited in claim 18, wherein said output signal manifests a value of said magnetic field which is integrative over said length.

20. A method for sensing the magnetic field as recited in claim 17, wherein said positioning includes positioning said fluxgate magnetometer so as to at least substantially hug said surface area.

* * * * *